(12) United States Patent
Ollmann

(10) Patent No.: US 8,745,111 B2
(45) Date of Patent: Jun. 3, 2014

(54) METHODS AND APPARATUSES FOR CONVERTING FLOATING POINT REPRESENTATIONS

(75) Inventor: Ian R. Ollmann, San Mateo, CA (US)

(73) Assignee: Apple Inc., Cupertino, CA (US)

( * ) Notice: Subject to any disclaimer, the term of this patent is extended or adjusted under 35 U.S.C. 154(b) by 749 days.

(21) Appl. No.: 12/947,699

(22) Filed: Nov. 16, 2010

(65) Prior Publication Data

US 2012/0124115 A1    May 17, 2012

(51) Int. Cl.
   *G06F 7/00*      (2006.01)
(52) U.S. Cl.
   USPC .................... 708/204; 708/495; 708/505
(58) Field of Classification Search
   None
   See application file for complete search history.

(56) References Cited

U.S. PATENT DOCUMENTS

| | | | |
|---|---|---|---|
| 6,430,589 B1 * | 8/2002 | Jennings, III | 708/620 |
| 7,330,864 B2 | 2/2008 | Yuval et al. | |
| 7,428,566 B2 | 9/2008 | Siu et al. | |
| 2006/0112160 A1 | 5/2006 | Ishii et al. | |
| 2008/0104160 A1 | 5/2008 | Kodama | |
| 2009/0150654 A1 | 6/2009 | Oberman et al. | |

OTHER PUBLICATIONS

Jeroen Van Der Zijp, "Fast Half Float Conversions", www.fox.-toolkit,org/ ftp/fasthalffloatconversion.pdf, Nov. 2008, Revised Sep. 2010, 6 pgs.
http://www.devmaster.net/forums/showthread.php?t=10924.
http://stackoverflow.com/questions/1659440/32-bit-to-16-bit-float-point-conversion, 2010, 6 pgs.
Industrial Light and Magic, Open XR, http://www.openexr.com, 2010, 7 pgs.
http://cellperformance-snippets.gogglecode,com , 2010, 1 pg.
http://acm.pku.edu.cn/JudgeOnline, 2010, 3 pgs.

* cited by examiner

*Primary Examiner* — Michael D Yaary
(74) *Attorney, Agent, or Firm* — Blakely, Sokoloff, Taylor & Zafman LLP

(57) ABSTRACT

A method and an apparatus that determine an addend in a first floating point format from a first representation of a number in the first floating point format are described. An arithmetic processing unit may be instructed to perform a floating point add operation to generate a sum in the first floating point format from the addend and the first representation. A second representation of the number in a second floating point format may be extracted directly from the sum. The first floating point format and the second floating point format may be based on different precisions for the first and second representation of the number.

21 Claims, 12 Drawing Sheets

200

Determining an addend represented in a first floating point format from a first representation of a number, the first floating point format having a first precision (e.g. based on a single precision floating point format) 201

Instructing a arithmetic processing unit to perform an addition operation to generate a sum of the first representation of the number and the addend, the addition operation being based on a rounding scheme of the first precision 203

Extracting a second representation of the number in a second floating point format from a representation of the sum in the first floating point format, the second floating point format having a second precision different from the first precision (e.g. based on a half precision floating point format) 205

Fig. 2

500A
Ns: Source number in single precision floating point 501
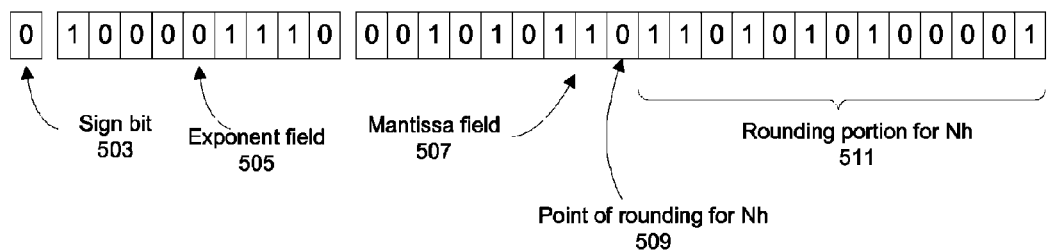
Sign bit 503
Exponent field 505
Mantissa field 507
Point of rounding for Nh 509
Rounding portion for Nh 511
Nh: Target number in half precision floating point 513
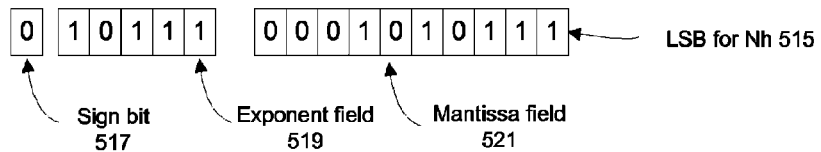
LSB for Nh 515
Sign bit 517
Exponent field 519
Mantissa field 521
Fig. 5A

500B

C1: first configuration to position the exponent field of Ns for target Nh (e.g. exp + exp >> 13) 523

| 0 | 1 | 0 | 0 | 0 | 0 | 1 | 1 | 1 | 0 | 0 | 0 | 0 | 0 | 1 | 0 | 0 | 0 | 0 | 1 | 1 | 1 | 0 | 0 | 0 | 0 | 0 | 0 | 0 | 0 | 0 | 0 |

C2: second configuration to align and round off the mantissa field of Ns for Nh
(e.g. 13 << 23) 525

| 0 | 0 | 0 | 0 | 0 | 1 | 1 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |

C3: third configuration to correct the bias of the exponent field of Ns for Nh
(e.g. (127-15) << 10) 527

| 0 | 0 | 0 | 0 | 0 | 0 | 0 | 0 | 0 | 0 | 0 | 0 | 0 | 0 | 1 | 1 | 1 | 0 | 0 | 0 | 0 | 0 | 0 | 0 | 0 | 0 | 0 | 0 | 0 | 0 | 0 | 0 |

C4: fourth configuration to hide the hidden bit of Ns for Nh (e.g. 1 << 10) 529

| 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 0 |

Magic number for Ns: a combination of C1, C2, C3 and C4
(e.g. ( C1+C2-C3-C4) , based on unsigned arithmetic operations) 533

| 0 | 1 | 0 | 0 | 1 | 0 | 1 | 0 | 0 | 0 | 0 | 0 | 0 | 0 | 0 | 1 | 0 | 1 | 1 | 0 | 0 | 0 | 0 | 0 | 0 | 0 | 0 | 0 | 0 | 0 | 0 | 0 |

| 0 | 1 | 0 | 0 | 0 | 0 | 1 | 1 | 1 | 0 | 0 | 0 | 1 | 0 | 1 | 0 | 1 | 1 | 0 | 1 | 1 | 0 | 1 | 0 | 1 | 0 | 1 | 0 | 0 | 0 | 0 | 1 |

Magic number for Ns 533

| 0 | 1 | 0 | 0 | 1 | 0 | 1 | 0 | 0 | 0 | 0 | 0 | 0 | 0 | 0 | 0 | 1 | 0 | 1 | 1 | 0 | 0 | 0 | 0 | 0 | 0 | 0 | 0 | 0 | 0 | 0 | 0 |

Sum = Ns + Magic number (based on single precision floating point arithmetic add operation) 539

| 0 | 1 | 0 | 0 | 0 | 0 | 1 | 1 | 1 | 0 | 0 | 0 | 1 | 0 | 1 | 0 | 0 | 1 | 0 | 1 | 1 | 1 | 0 | 0 | 0 | 1 | 0 | 1 | 0 | 1 | 1 | 1 |

```
cl_ushort my_conversion0( float f )
{
union{ float f; unsigned int u;}u = {f};
u.f = f + big_table[ u.u >> 23 ];
return u.u;
}
```

603 const float table[512] = { 0x1.000000p-1f, ..., 0x1.000000p-1f, 0x1.000800p0f, 0x1.001000p1f,
0x1.001800p2f, 0x1.002000p3f, 0x1.002800p4f, 0x1.003000p5f,
0x1.003800p6f, 0x1.004000p7f, 0x1.004800p8f, 0x1.005000p9f,
0x1.005800p10f, 0x1.006000p11f, 0x1.006800p12f, 0x1.007000p13f,
0x1.007800p14f, 0x1.008000p15f, 0x1.008800p16f, 0x1.009000p17f,
0x1.009800p18f, 0x1.00a000p19f, 0x1.00a800p20f, 0x1.00b000p21f,
0x1.00b800p22f, 0x1.00c000p23f, 0x1.00c800p24f, 0x1.00d000p25f,
0x1.00d800p26f, 0x1.00e000p27f, 0x1.00e800p28f, nan( "0x7c00" ),
nan( "0x7c00" ), nan( "0x7c00" ), ...
-0x1.010000p-1f, ..., -0x1.010000p-1f, -0x1.010800p0f, -0x1.011000p1f,
- 0x1.011800p2f, -0x1.012000p3f, -0x1.012800p4f, -0x1.013000p5f,
- 0x1.013800p6f, -0x1.014000p7f, -0x1.014800p8f, -0x1.015000p9f,
- 0x1.015800p10f, -0x1.016000p11f, -0x1.016800p12f, -0x1.017000p13f,
- 0x1.017800p14f, -0x1.018000p15f, -0x1.018800p16f, -0x1.019000p17f,
- 0x1.019800p18f, -0x1.01a000p19f, -0x1.01a800p20f, -0x1.01b000p21f,
- 0x1.01b800p22f, -0x1.01c000p23f, -0x1.01c800p24f, -0x1.01d000p25f,
- 0x1.01d800p26f, -0x1.01e000p27f, -0x1.01e800p28f, nan( "0xfc00" ),
nan( "0xfc00" ), nan( "0xfc00" ), ...

```
float big_table[512];
float table_entry( float f )
{
union{ float f; unsigned int u;}u = {f};
unsigned int sign = u.u & 0x80000000;
unsigned int exp = u.u & 0x7f800000;
unsigned int magic = exp + (exp >> 13);
magic += (13<<23) - (((127-15)+1) << 10);
magic = MAX( magic, 0x3f000000 );
if( exp >= 0x47800000 )  magic = 0x7fc07c00;
sign |= sign >> 16;
u.u = magic | sign;
return u.f;
}
```

_703_

```
union { cl_uint u; float f; } u;
u.u = 0;
do
{
big_table[u.u >> 23] = table_entry( u.f );
u.u += 0x00800000;
} while (u.u != 0xff800000 );
```

```
cl_ushort my_conversion( float f )                                801
{
union{ float f; cl_uint u; }u = {f};
cl_uint i = (u.u >> 23) & 0xff; // extract exponent
cl_ushort sign =(u.u >> 16) & 0x8000;
i = MAX( i, 127 - 15);
i = MIN( i, 127 + 16);
i -= 127-15;
u.f = fabsf(u.f);
u.f += table[i];
return u.u | sign;
}
                                                                  803
```

```
const float table[32] = { 0x1.000000p-1f, 0x1.000000p-1f, 0x1.000800p0f,
0x1.001000p1f,
0x1.001800p2f, 0x1.002000p3f, 0x1.002800p4f, 0x1.003000p5f,
0x1.003800p6f, 0x1.004000p7f, 0x1.004800p8f, 0x1.005000p9f,
0x1.005800p10f, 0x1.006000p11f, 0x1.006800p12f, 0x1.007000p13f,
0x1.007800p14f, 0x1.008000p15f, 0x1.008800p16f, 0x1.009000p17f,
0x1.009800p18f, 0x1.00a000p19f, 0x1.00a800p20f, 0x1.00b000p21f,
0x1.00b800p22f, 0x1.00c000p23f, 0x1.00c800p24f, 0x1.00d000p25f,
0x1.00d800p26f, 0x1.00e000p27f, 0x1.00e800p28f, __builtin_nanf("0x7c00")
};
```

```
#include <smmintrin.h>
#include <tmmintrin.h>
typedef float float4 __attribute__((vector_size(16)));
typedef int int4 __attribute__((vector_size(16)));                      901
typedef unsigned char uchar16 __attribute__((vector_size(16)));
void my_conversion_vec( float4 v, unsigned short *result )
{
int4 signBit = _mm_and_si128( (int4) v,
            (int4) { 0x80000000, 0x80000000, 0x80000000, 0x80000000 } );
v = _mm_andnot_ps( (float4) {-0.0f, -0.0f, -0.0f, -0.0f }, v ); // v = |v|
v = (float4) _mm_min_epi32( (int4) v,
            (int4) {0x47800000, 0x47800000, 0x47800000, 0x47800000 } );
int4 magic = _mm_and_si128( (int4) v,
            (int4){ 0x7f800000, 0x7f800000, 0x7f800000, 0x7f800000 } );
int4 half_exp = _mm_srli_epi32( magic, 13 );
magic = _mm_add_epi32( magic,
            (int4){ (13<<23) - ((127-14) << 10), (13<<23) - ((127-14) << 10),
                    (13<<23) - ((127-14) << 10), (13<<23) - ((127-14) << 10) } );
magic = _mm_add_epi32( magic, half_exp );
magic = _mm_max_epi32( magic,
            (int4){ 0x3f000000, 0x3f000000, 0x3f000000, 0x3f000000 } );
magic = (int4) _mm_add_ps( v, (float4) magic );
magic = _mm_or_si128( magic, _mm_srli_epi32( signBit, 16 ) );
magic = _mm_shuffle_epi8( magic,
            (uchar16){ 0, 1, 4, 5, 8, 9, 12, 13, -1, -1, -1, -1, -1, -1, -1, -1 } );
_mm_storel_epi64( (void*) result, magic );
}
```

Fig. 9

METHODS AND APPARATUSES FOR CONVERTING FLOATING POINT REPRESENTATIONS

FIELD OF INVENTION

The present invention relates generally to data type conversion. More particularly, this invention relates to converting floating point representations with different precisions.

BACKGROUND

Half precision (16-bit) floating point numbers are commonly used in computing where floating point range and precision are less important than memory footprint. Common applications using half-precision floating point numbers may include graphics, imaging, (e.g. the OpenEXR specification, CoreImage, Aperture, etc.) or a limited set of scientific applications. Typically data is stored in memory in the half-precision floating point format (e.g. specified by IEEE-754 standard, 2008) and converted to the single precision floating point format before arithmetic operations are performed with the data. The half precision floating point format may be sufficiently well used that some devices, such as GPUs (Graphics Processing Units) and mobile phones, may support hardware conversions between half-precision and single-precision. Some devices even are capable of doing arithmetic directly on the half precision floating point format.

However, a large class of devices, mostly desktop CPUs (Central Processing Units), do not provide hardware to convert between single precision and half precision floating point formats. Achieving correct software conversion from single precision to half precision can be especially onerous, due to the requirement by IEEE-754 that such conversion proceed by the current rounding mode, which by default is usually the IEEE-754 round to nearest, ties to even rounding mode. For example, in image processing (or other computations), converting the data from the single precision format to the half precision format without proper rounding, such as always rounding to zero, may cause a gradual drift of the data towards zero. As a result, the image based on the data would gradually get darker in image processing.

In addition, due to the limited range of the half precision floating point format, correct handling of subnormal conversion results (e.g. having subnormal floating point values based on IEEE-754 floating point standard), which are stored representation formats different from those of normal numbers, may further increase the complications of the conversions. Thus, a large number of instructions may be required to perform the conversions to cause a significant bottleneck in application performance.

Therefore, traditional approaches to convert floating point representations between different precisions tend to be slow, inexact or erroneous.

SUMMARY OF THE DESCRIPTION

A method and an apparatus are disclosed to convert an input single precision (or full precision) floating point value to a half precision floating point value based on a floating point adder and a single add operation via the floating point adder between the input value and a magic value determined from the input value. The floating point adder may speedily provide the right answer (e.g. with correct rounding) for the conversion without taking subnormal stalls. The magic value may be determined from the sign and exponent fields of the input floating point value. The resulting half precision floating point value may be contained in the least significant portion (e.g. lower sixteen bits) of a thirty two bit sum from the single add operation. The magic value may be either calculated in real time based on the sign and exponent fields of the input floating point value or read from a lookup table using a top portion (e.g. nine top bits) from the input floating point value to index the table.

In one embodiment, the conversion may round correctly according to a floating point rounding mode currently configured in the floating point adder. The floating point rounding mode may be based on one of the four rounding rules specified in IEEE-754 standard, i.e. round to nearest, round toward zero, round toward positive infinity and round toward minus infinity. The adder can correctly handle the exponent field of the half precision floating point result in a mantissa field of a single precision floating point representation. Applicable values for the conversion may include special cases such as subnormal values, infinities, and examples where rounding would cause the mantissa to overflow into the exponent field. In some embodiments, the conversion may be applied to single precision data if the single precision data does not contain NaNs (special values in floating point format such as Not a Number values as specified in IEEE-754 standard) and/or if a correct conversion of NaNs is not required.

In one embodiment, rounding and denormalization operations in the conversion of a floating point value to a half precision floating point value can be handled by standard floating point hardware concurrently. The floating point value is not required to be rounded to the precision of a (sub) normal result before an operation (e.g. multiplication) to correct for the difference in floating point biases of different precisions. The denormalization can be performed entirely in a floating point mantissa such that "denormal-stall" does not occur except when the single precision float point value (e.g. f) is itself subnormal (e.g. $|f|<2^{-126}$). In one embodiment, subnormal values may be handled in the denormalization without incurring the stall and without substituting zero in place for the value. A stall may be caused by a kernel trap to execute patching software codes which might cost thousands or tens of thousands of processor cycles (e.g. in hardware based denormalization performed in an exponent field).

In one embodiment, the stall can be eliminated by setting appropriate floating point configuration control bits to flush subnormal values to zero such that the desirable correct subnormal half precision floating point result can be generated instead of only zero. A "denormal-stall" may indicate a processing system takes a large stall (or large number of instruction cycles) when a denormal (or subnormal) number is encountered in the data processing system while a correct result of the denormal number is being calculated by the data processing system. Even if a stall may be caused by a single precision input value (for the conversion) which is subnormal, the half precision resulting value can be converted without the denormal-stall. Desirable and correct subnormal half precision floating results from the conversion can be obtained (instead of zero) to avoid, for example, visible artifacts in images when the conversion is applied in image applications.

An embodiment of the present invention includes methods and apparatuses that determine an addend in a first floating point format from a first representation of a number in the first floating point format. An arithmetic processing unit may be instructed to perform a floating point add operation to generate a sum in the first floating point format from the addend and the first representation. A second representation of the number in a second floating point format may be extracted directly from a floating representation of the sum. The first floating point format and the second floating point format may be based on different precisions for the first and second representation of the number.

In another embodiment, a sign bit and an exponent field may be extracted from a first representation representing a number in a single precision floating point format. An addend in the single precision floating point format may be obtained using the sign bit and the exponent field via a lookup table. A single precision floating point operation may be performed to add the first representation of the number and the addend for a resulting sum represented in bits. A portion of the bits of the resulting sum may be selected as a second representation representing the number in half precision floating point format.

In yet another embodiment, a logic for converting floating point formats having different precisions may comprise an addend generator logic and an adder logic. The addend generator logic may generate an addend in a first floating point format from a first number of the first floating point format. The first floating point format may have a first precision. The adder logic may perform a floating point add operation on the first number with the addend to provide a sum in the first floating point format. The adder logic may include a rounding scheme (or mode) of the first precision. The sum may include a second number of a second floating point format having a second precision. The second number may represent a conversion of the first number from the first floating point format to the second floating point format.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which:

FIG. 2 is a flow diagram illustrating one embodiment of a process to convert representations of a number with different floating point precisions;

FIGS. 5A-5C illustrating an example to convert a floating point representation from a single precision to a half precision according to one embodiment of the present invention;

FIG. 6 is a sample code for floating point conversion based on a lookup table according to one embodiment of the present invention;

FIG. 7 is a sample code to provide a lookup table for floating point conversion according to one embodiment of the present invention;

FIG. 8 is a sample code for floating point conversion using an optimized lookup table according to one embodiment of the present invention;

FIG. 9 is a sample code for performing multiple floating point conversions concurrently according to one embodiment of the present invention;

DETAILED DESCRIPTION

Figure 1:
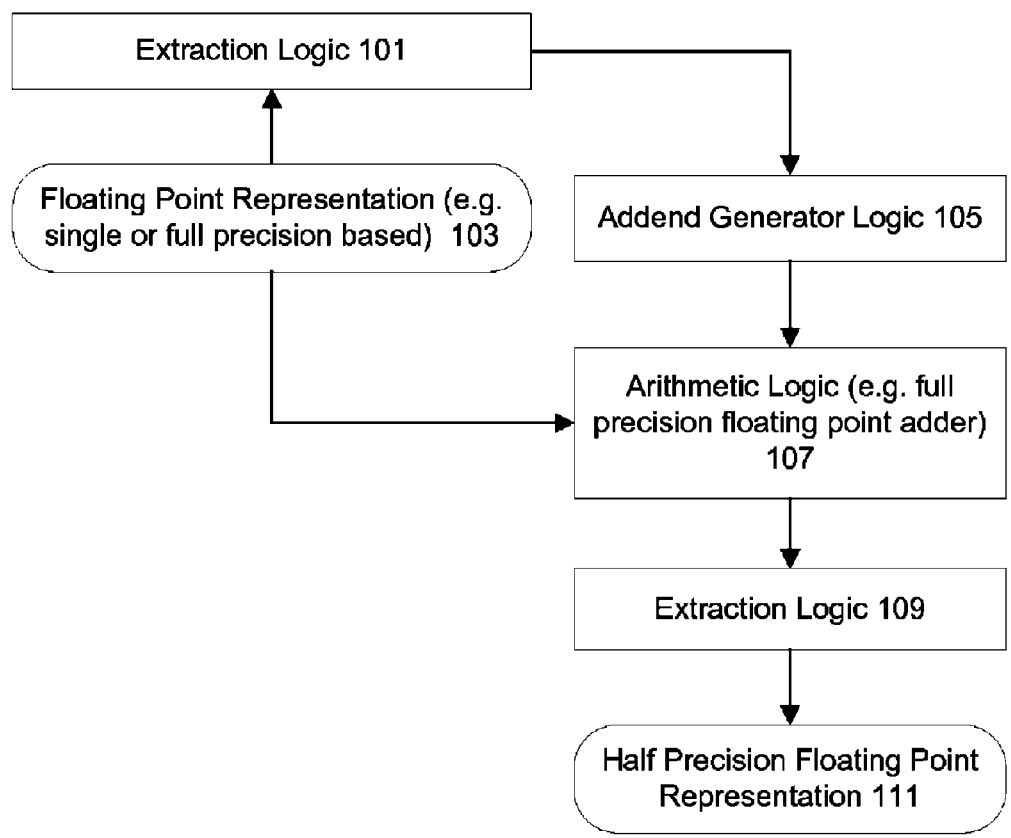
FIG. 1 is a block diagram illustrating a design according to one embodiment of the present invention.

Methods and apparatuses for converting floating point representations are described herein. In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

The processes depicted in the figures that follow, are performed by processing logic that comprises hardware (e.g. circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

In one embodiment, the result of rounding a binary floating point value (e.g. based on IEEE-754 standard) to a specific point in its representation may be directly retrieved from a representation of a result of a single arithmetic addition operation without the need for another arithmetic subtraction nor other arithmetic operations. The arithmetic operation may be performed on the binary floating point value with an appropriate large power of two, which may be chosen such that the point of rounding is the least significant bit (LSB) in the representation of the result (or sum). Although an arithmetic rounding can be based on adding the appropriate power of two to the value and subtract it away again, the subtraction may not be needed.

For example, to round a binary floating point value, the value and an appropriate large power of two (e.g. $2^{**}M$) may be input operands to an arithmetic adder, such as a floating point adder. The rounded input value may be available in unnormalized format (e.g. not encoded according to a normalized floating point format defined according to IEEE-754 standard) in the low X number of bits of a floating point representation of the sum. In one embodiment, the rounded result may be represented as a standard unsigned integer with sign given by the sign bit of the input operand and with exponent derivable from the sum exponent. Such rounding operations are typically applied when the corresponding operations are not available in hardware, or cannot be proven to be available in hardware quickly enough (when precise details of the hardware to be used are not known in advance).

In one embodiment, an input floating point value may be rounded to 11 bits of precision (e.g. the precision of a half precision floating point number) in an adder by correctly choosing the right value for the power of an appropriate large power of two (e.g. M in $2^{**}M$) as another input to the adder. By choosing a different value of M, the input value may be rounded to less precision as necessary, for example, to correctly round subnormal half precision results. Furthermore, the unnormalized format of the sum provided by the adder may include the least significant 10 bits of a denormalized half precision result. Denormalized half precision results may be characterized by zero exponents (i.e. exponents with value zero). For normalized results, the leading "1" bit at bit position 10 generated in the adder may be removed. The least significant bit may be located at bit position 0. An appropriate exponent and sign for the half-precision result may be configured by putting the sign and exponent-1 of the input value in the appropriate bit positions in an addend to create a magic value such that a single add operation in the adder adding the magic value and the input value may produce directly a correctly rounded half precision result in the least significant 16 bits of the floating point result. The adder may be a floating point adder which is commonly available on data processing systems that support single precision floating point format. Such a conversion to a half precision floating point value may signal inexact correctly if the input floating point value does not cause overflow.

In one embodiment, a large (512-entry) lookup table of magic values may be employed to identify a magic value corresponding to an input floating point value for conversion to a half precision floating point value. The lookup table may be indexed using a certain number (e.g. 9) of the most significant bits of the input floating point value. Optionally, an optimization may be applied to remove repetitions in the large table to reduce the number of entries in the lookup table (e.g. from 512 entries down to 32 entries), thus to reduce the required memory cache to store the lookup table. Converting floating point representations using the optimized lookup table may include an additional arithmetic processing to copy the sign bit. A better cache behavior of the conversion may be achieved at the expense of such additional arithmetic computation.

In one embodiment, the conversion of floating point representations may employ runtime arithmetic computation in place of runtime table lookup to generate magic values. For example, some programming environments may require SIMD (single instruction multiple data) style vector code (or execution instructions) for better performance. Table lookup may be avoided in such environments as SIMD units typically are not good (or not efficient) at accessing lookup tables. A magic value may be generated based on the sign and exponent fields of an input floating point value in a predicable manner, e.g. using a few "shift" and "add" operations. The conversion can be performed at high performance with or without a lookup table, depending on the relative performance strengths of table lookup versus brute force computation in the hardware hosting the conversion.

In one embodiment, results of converting floating point representations of NaNs may depend on which NaN is generated by the system via the operation of "NaN1+NaN2". If NaN1 is returned (i.e. NaN("0x7c00")), then (half) infinity may be the result. If NaN2 (e.g. the input value) is returned, then the low bits of the input value may be the result, which may nearly always be 0.

FIG. 1 is a block diagram illustrating a design according to one embodiment of the present invention. Logic 100 may comprise hardware (e.g. circuitry, dedicated logic, etc.), software (such as is run on a general-purpose computer system or a dedicated machine), or a combination of both. For example, addend generator logic 105 may be based on executable instructions executed in a processor including arithmetic logic 107. An input floating point value may be stored as floating point representation 103 in a storage location, such as in a memory, a register or other applicable storage medium. In one embodiment, representation 103 may comprise 32 binary bits for the single (or full) precision floating point format. A half precision floating point value converted from representation 103 may be stored in half precision floating point representation 111 comprising 16 binary bits according to the half precision floating point format. Note that more than one representations in a floating point format of a limited precision may represent a common number, which value may require more than the limited precision for precise representation.

In one embodiment, arithmetic logic 107 may perform a single arithmetic operation on floating point representation 103 to generate a result that contains a corresponding half floating point representation converted from representation 103. Arithmetic logic 107 may be a regular arithmetic logic unit capable of performing floating point add operations and/or integer add operation, such as in a central processor, a graphics processor or other applicable processors. A certain round off mode (e.g. round to the nearest) may be configured (e.g. preconfigured) in arithmetic logic 107 to perform rounding operations due to limited precisions available.

In one embodiment, extraction logic 101 may select or extract a portion of bits from representation 103 to generate a magic number for floating point conversion. For example, extraction logic 101 may select the sign field (or bit) and the exponent field of representation 103 while ignoring the mantissa field. Addend generator logic 105 may generate a magic value for representation 103 based on extracted portions from extraction logic 101 to control or configure a floating point add operation via arithmetic logic 107 for floating point conversion. The magic value may include configurations to cause a single precision floating point value converted from representation 103 to be present in a floating point sum provided by arithmetic logic 107 as a result of adding representation 103 and the magic value.

In one embodiment, addend generator logic 105 may include a lookup table to set up configurations for converting representation 103. The lookup table may be populated in advance depending on, for example, the precision of representation 103. The configurations may include a setting retrieved from the lookup table according to an index derived from portions of representation 103, such as extracted via extraction logic 101. Addend generator logic 105 may combine the configurations into one single magic value as an input addend for a floating point add operation in arithmetic logic 107. In one embodiment, extraction logic 109 may directly extract a half precision floating point value as a result of floating point conversion from representation 103. For example, extraction logic 109 may select the lower 16 bits of a single precision floating point sum, which has 32 bits in length, provided by arithmetic logic 107 for representation 111 as a result of converting representation 103.

FIG. 2 is a flow diagram illustrating one embodiment of a process to convert representations of a number with different floating point precisions. Exemplary process 200 may be performed by a processing logic that may comprise hardware (circuitry, dedicated logic, etc.), software (such as is run on a dedicated machine), or a combination of both. For example, process 200 may be performed by some components of logic 100 of FIG. 1. At block 201, the processing logic of process may determine an addend represented in a first floating point format from a first representation of a number to convert floating point representations of the number. The first floating point format may be based on IEEE-754 standard using a single precision, double precision or other applicable precisions. The first representation of the number and the addend may be represented in a common floating point format.

According to one embodiment, the processing logic of process 200 may perform a table lookup operation to retrieve a configuration for the addend based on a portion of the first representation. Alternatively, the processing logic of process 200 may perform bit shift and/or integer addition operations to obtain the configuration for the addend.

At block 203, the processing logic of process 200 may instruct an arithmetic processing unit to perform an addition operation for converting floating point representations of an input number. The addition operation may be a floating point addition operation, such as a single precision floating point addition operation, based on a first representation of the input number in a first floating point format. In some embodiments, the floating point addition operation may include rounding operations to accommodate the limited precision of the first floating point format. The rounding operations may be based on a rounding mode selected from multiple rounding modes available in the arithmetic processing unit, for example, to achieve optimized results without being limited to a single rounding mode (e.g. not limited to round to zero mode).

The processing logic of process 200 may perform a floating point addition operation to sum up a first representation of an input number in a first floating point format and an addend derived from the input number. As a result, a half precision floating point representation of the input number may be directly available from a sum represented in the first floating point format. The addend may include configurations to control the addition operation for generating the half precision floating point representation of the input number. At block 205, in one embodiment, the processing logic of process 200 may extract a second representation of the number in a second floating point format, e.g. the half precision floating format, directly from the representation of the sum in the first floating point format. For example, the processing logic of process 200 may select the second (or lower) 16 bits from a single precision floating point representation (32 bits) of the sum as the half precision floating point representation of the input number.

Figure 3:
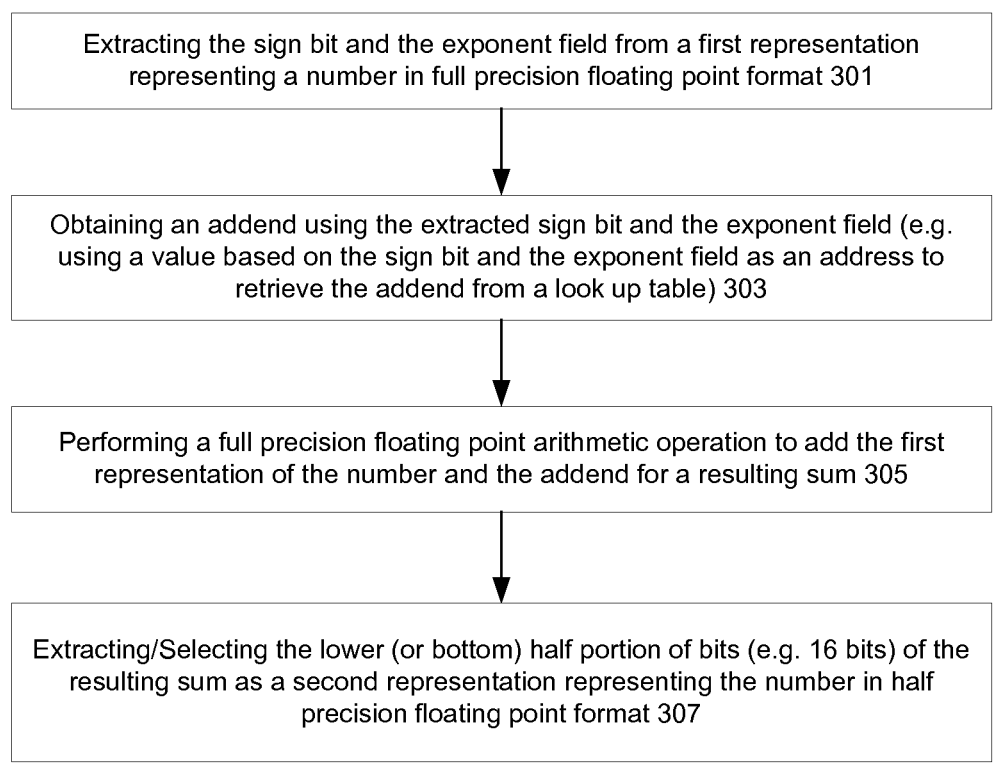
FIG. 3 is a flow diagram illustrating one embodiment of a process to convert a single precision floating point representation of a number to a half precision floating point representation.

FIG. 3 is a flow diagram illustrating one embodiment of a process to convert a single precision floating point representation of a number to a half precision floating point representation. Exemplary process 300 may be performed by a processing logic that may comprise hardware (circuitry, dedicated logic, etc.), software (such as is run on a dedicated machine), or a combination of both. For example, process 300 may be performed by some components of log 300 of FIG. 1. At block 301, the processing logic of process 300 can extract the sign bit and the exponent field from a first representation representing a number in full precision floating point format. The extraction may be based on logical bit wise operations on the first representation (e.g. 32 bits in length) for bit selection.

At block 303, the processing logic of process 300 may obtain an addend from the sign bit and the exponent field of the first representation of the number in full precision floating point format. Thus, the addend may be determined for the first representation independent of the mantissa field of the first representation. In one embodiment, the processing logic of process 300 may use a value based on the sign bit and the exponent field as an address to retrieve the addend from a lookup table.

Subsequently, at block 305, the processing logic of process 300 may perform a full precision floating point arithmetic operation to add the first representation of the number and the addend for a resulting sum. The addend may be configured to cause a half precision floating point representation of the number to be directly and explicitly available (e.g. without a need for additional bit wise operations) from a collection of bits representing the sum in the full precision floating point format. In one embodiment, the processing logic of process 300 may extract or select the lower (or bottom) half portion of bits (e.g. 16 bits) of the resulting sum as a second representation representing the number in half precision floating point format at block 307.

Figure 4:
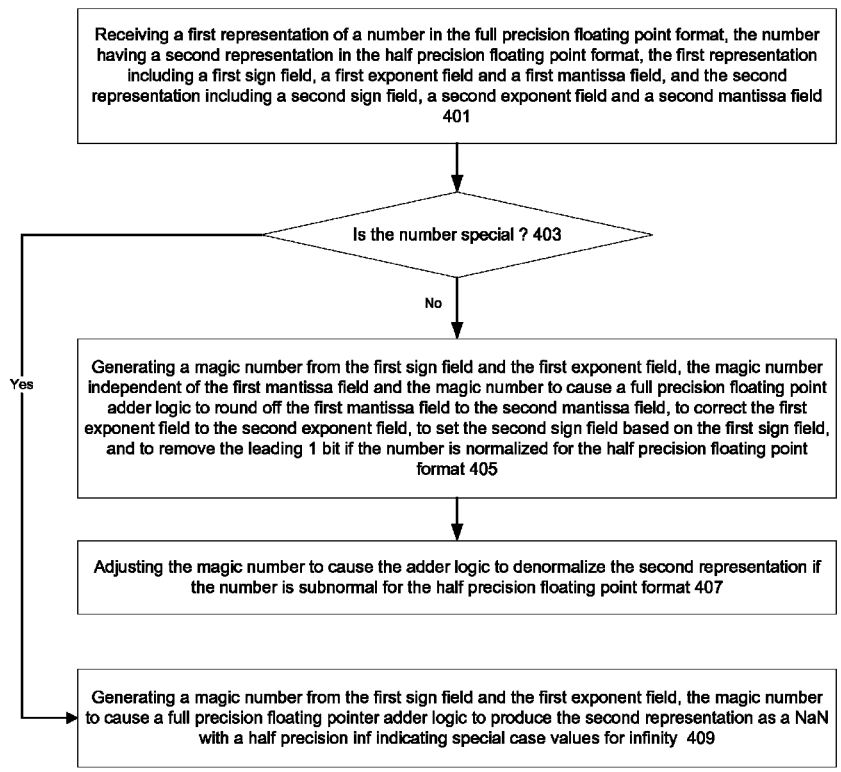
FIG. 4 is a flow diagram illustrating one embodiment of a process to obtain an addend from a single precision floating point number for type conversion.

FIG. 4 is a flow diagram illustrating one embodiment of a process to obtain an addend from a single precision floating point number for type conversion. Exemplary process 400 may be performed by a processing logic that may comprise hardware (circuitry, dedicated logic, etc.), software (such as is run on a dedicated machine), or a combination of both. For example, process 400 may perform operations for process 200 at block 201 of FIG. 2. In one embodiment, the processing logic of process 400 may receive a first representation of a number in the full precision floating point format at block 401. The first representation may include a first sign field, a first exponent field and a first mantissa field. The number may alternatively be represented in the half precision floating point format as a second representation including a second sign field, a second exponent field and a second mantissa field.

At block 403, the processing logic of process 400 may determine if the first representation indicates that the number is a special number, such as a NaN which represents a value that is not a real number according to the specification of the floating point format (e.g. having a bit pattern with an exponent field of all 1s and a non-zero mantissa field as described in IEEE-754 standard). The processing logic of process 400 may compares the first exponent with a threshold value to determine if the number is special number. At block 409, if the number is a special number, the processing logic of process 400 may generate a magic number from the first sign field and the first exponent field. The magic number may cause a full precision floating pointer adder logic to produce the second representation as a NaN with a half precision "inf" as it payload indicating a special case value for infinity.

At block 405, if the number is not special, the processing logic of process 400 may generate a magic number from the first sign field and the first exponent field. The magic number may be generated independent of the first mantissa field. In one embodiment, the magic number may include configurations to cause a full precision floating point adder logic to produce the second representation of the number in half precision floating point format as a result of one floating point addition operation. For example, the floating point adder logic may be configured, according to the magic number, to round off the first mantissa field to the second mantissa field, to correct the first exponent field to the second exponent field, to set the second sign field (or bit) based on the first sign field, and to remove the leading 1 bit if the number is normalized for the half precision floating point format.

At block 407, the processing logic of process 400 may adjust the magic number to cause the adder logic to denormalize the second representation if the number is subnormal for the half precision floating point format. For example, the processing logic of process 400 may set a floor (or a minimum threshold number, e.g. 0x3f000000) such that the resulting sum generated from the adder logic includes the second representation already denormalized in half floating point precision format.

FIGS. 5A-5C illustrating an example to convert a floating point representation from a single precision to a half precision according to one embodiment of the present invention, e.g. based on logic 100 of FIG. 1. Turning now to FIG. 5A, example 500A may illustrate converting source number Ns 501 in full precision floating point format to target number Nh 513 in half precision floating point format. Ns 501 may be represented in a bit pattern with 32 bits, including sign bit 503, 8 bits of exponent field 505 and 23 bits of mantissa field 507. To convert Ns 501 to Nh 513, mantissa field 507 may be rounded for mantissa field 521. Point of rounding 509 maybe rounded from rounding portion 511 of Ns 501 to be the LSB 515 of Nh 513. Sign bit 517 of Nh 513 may be copied from sign big 503 of Ns 501. Exponent field 519 may be corrected from exponent field 505 according to the difference between full precision bias and half precision bias in floating point formats.

Turning now to FIG. 5B, example 500B may illustrate configurations to generate a magic number to convert source number Ns 501 to target number Nh 513 of FIG. 5A. For example, C1 523 may represent a first configuration to position exponent field 505 of Ns 501 for target representation Nh 513 using the same number of bits (i.e. 32 bits) as in a single precision floating point format. In one embodiment, C1 523 may be generated based on 32 bit based integer arithmetic/bitwise operations on exponent field 505 (e.g. exp) extracted from Ns (e.g. exp+exp>>13). C2 525 may be a second configuration to align and round off mantissa field 507 field of Ns to provide mantissa field 521 of Nh 513. C2 525 may be configured as a 32 bit pattern having a value as 13<<23. C3 527 may be a third configuration to correct the bias of a single floating point format for a half floating point format. C3 527 may be configured as a 32 bit pattern having a value as (127−15)<<10. C4 529 may be a fourth configuration to hide the hidden bit of Ns for Nh. C4 529 may be configured as a 32 bit pattern having a value as 1<<10. Magic number 533 for Ns may include a combination of the configurations C1 523, C2 525, C3 527 and C4 529, for example, according to C1+C2−C3−C4 based on unsigned arithmetic operations.

Turning now to FIG. 5C, example 500C may illustrate converting a single precision floating point number Ns 501 to half precision floating point number Nh 513 using magic number 533 generated from Ns 501. For example, Sum 539 may be a result of a single add (or addition) operation with Ns 501 and magic number 533 based on single precision floating point format. The lower portion (e.g. 16 bits) of Sum 539 may correspond to the desired half precision floating point number Nh 513, which may be directly available via simple bit selection from Sum 539.

FIG. 6 is a sample code for floating point conversion based on a lookup table according to one embodiment of the present invention. For example, code 600 illustrates conversion module 601 including instructions for converting input single precision floating point value f to a half precision floating point representation. Conversion module 601 may be executed in an operating environment hosted by a processor having an arithmetic logic unit capable of performing single precision floating point operations. In one embodiment, conversion module 601 may perform operations such as loading a magic number from table 603 using bit shifting operation, an arithmetic add operation and a bitwise selection operation. Table 603 may include 512 entries of magic numbers. Bitwise selection may cause the bits positioned in a floating point representation to be used as a unsigned integer instead without any change to the value at those bit positions. The selection operation may typically be either free, or at worst, corresponding to a data move from one register file to another, depending on the underlying system architecture.

FIG. 7 is a sample code to provide a lookup table for floating point conversion according to one embodiment of the present invention. In one embodiment, code 700 illustrates table generator module 701 to populate table 603 of FIG. 6. Table generator module 701 may include instructions to cause an input floating point value which is large and/or has a NaN value to be converted to "inf" in half precision floating point format, e.g. based on a comparison with a configured threshold value "0x47800000".

Table generator module 701 may change an exponent extracted from input floating point value to set the correct rounding position for LSB in a half precision floating point format, to adjust the exponent bias from single precision to half precision floating point representation, to adjust a magic value for denormalize a resulting half floating point value which is subnormal, and to round off input floating point value to a correct position via one single precision floating point add operation. Comparison operations (e.g. for minimum and/or maximum threshold values) may be based on 32-bit unsigned integer or floating point operations using the same bit pattern. In one embodiment, code 703 may include instructions to iterate through available exponents (and sign bits) for single precision floating point format and populate the table storing magic values. In one embodiment, the sign bit may be lumped together in the lookup table generated, which may contain about redundant values. Alternatively, to reduce table size, the sign bit can be simply shifted in place during runtime with appropriate masking to avoid other bits in the input float point value.

FIG. 8 is a sample code for floating point conversion using an optimized lookup table according to one embodiment of the present invention. For example, code 800 may illustrate conversion module 801 including instructions to convert floating point representation using an optimized table 803 by handing (or updating) the sign bit separately during runtime. Exponents of single precision floating point format may be clamped to the edges of table 803 if the exponents are either too small or too big (e.g. in comparison with predetermined threshold values). As a result, table 803 can be optimized to 31 entries compared with 512 entries in table 603 of FIG. 6.

FIG. 9 is a sample code for performing multiple floating point conversions concurrently according to one embodiment of the present invention. For example, code 900 may include vector conversion module 901 including instructions to convert 4 floating point values at a time and write 4 half precision floating point values to a result. Vector conversion module 901 may set aside sign bit and extract exponent field from an input floating point value. Vector conversion module 901 may clamp the extracted exponent field to a fixed number 0x1.0p16f if the input floating point value is large (compared with a threshold value) or of special value (e.g. inf, NaN). Vector conversion module 901 may synthesize a magic value on the fly during runtime from an optimized table with 32 entries without handling the sign bit. In one embodiment, floating point hardware may be instructed to perform main processing tasks (e.g. using correct and desirable round off mode) in a single floating point add operation to generate a result containing the converted half precision value. Subsequently, the sign bit may be updated to the result. The least significant two bytes of each floating point result may be extracted to the memory to complete conversion of floating point representations.

Figure 10:
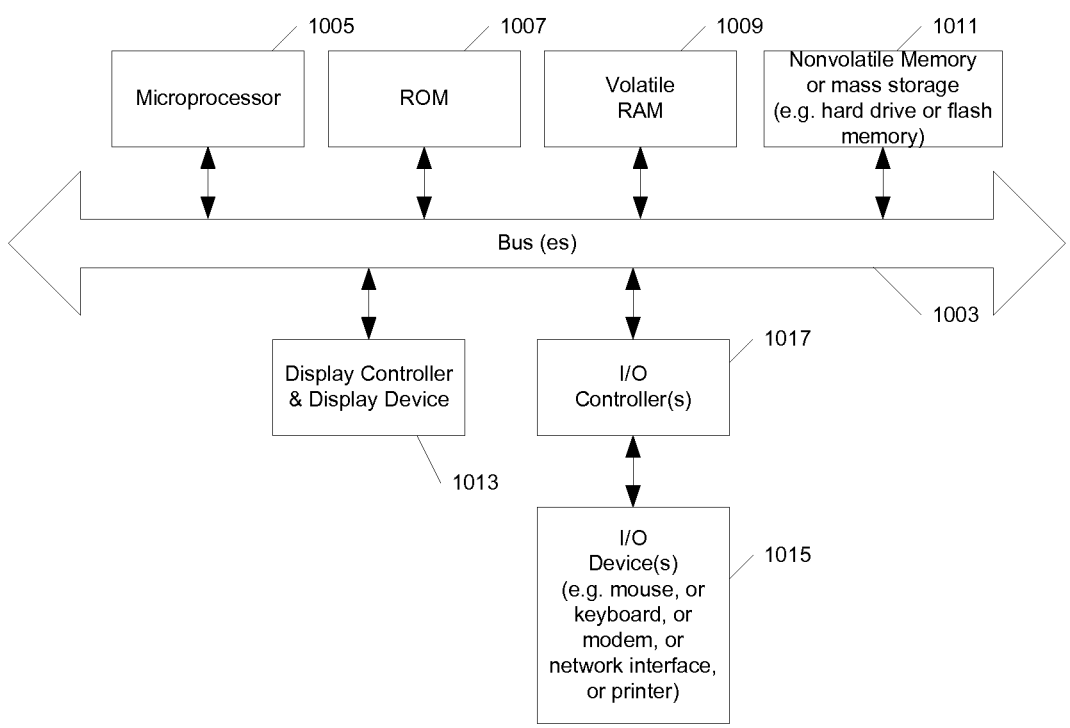
FIG. 10 illustrates one example of a data processing system such as a computer system, which may be used in conjunction with the embodiments described herein.

FIG. 10 shows one example of a data processing system such as a computer system, which may be used with one embodiment in the present invention. For example, the system 1000 may be implemented as a part of the system shown in FIG. 1. Note that while FIG. 10 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention.

As shown in FIG. 10, the computer system 1000, which is a form of a data processing system, includes a bus 1003 which is coupled to a microprocessor(s) 1005 and a ROM (Read Only Memory) 1007 and volatile RAM 1009 and a non-volatile memory 1011. The microprocessor 1005 may retrieve the instructions from the memories 1007, 1009, 1011 and execute the instructions to perform operations described above. The bus 1003 interconnects these various components together and also interconnects these components 1005, 1007, 1009, and 1011 to a display controller and display device 1013 and to peripheral devices such as input/output (I/O) devices which may be mice, keyboards, modems, network interfaces, printers and other devices which are well known in the art. Typically, the input/output devices 1015 are coupled to the system through input/output controllers 1017. The volatile RAM (Random Access Memory) 1009 is typically implemented as dynamic RAM (DRAM) which requires power continually in order to refresh or maintain the data in the memory.

The mass storage 1011 is typically a magnetic hard drive or a magnetic optical drive or an optical drive or a DVD RAM or a flash memory or other types of memory systems which maintain data (e.g. large amounts of data) even after power is removed from the system. Typically, the mass storage 1011 will also be a random access memory although this is not required. While FIG. 10 shows that the mass storage 1011 is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface or wireless networking interface. The bus 1003 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g. an abstract execution environment such as a "virtual machine" (e.g. a Java Virtual Machine), an interpreter, a Common Language Runtime, a high-level language virtual machine, etc.), and/or, electronic circuitry disposed on a semiconductor chip (e.g. "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

An article of manufacture may be used to store program code. An article of manufacture that stores program code may be embodied as, but is not limited to, one or more memories (e.g. one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g. a server) to a requesting computer (e.g. a client) by way of data signals embodied in a propagation medium (e.g. via a communication link (e.g. a network connection)).

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations described herein. This apparatus may be specially constructed for the required purpose, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A logic for converting floating point formats having different precisions, the logic comprising:
an addend generator logic to generate an addend in a first floating point format from a first number of the first floating point format, the first floating point format having a first precision, wherein the first number is represented via a plurality of bits, wherein the bits represent the first number based on the first floating point format, wherein the bits represent a first integer based on an unsigned integer format, the bits include a signed portion, an exponent portion and a mantissa portion for the first floating point format, the signed portion of the bits representing a second integer based on the unsigned integer format, the exponent portion of the bits representing a third integer based on the unsigned integer format, the mantissa portion of the bits representing a fourth integer based on the unsigned integer format, the first integer being equal to an arithmetic sum of the second integer, the third integer and the fourth integer, wherein the addend corresponds to a fifth integer based on the unsigned integer format, and wherein the fifth integer corresponds to a result of arithmetic operations on a representation of the third integer based on the unsigned format, the result being independent of the fourth integer; and
an adder logic to perform a floating point add operation on the first number and the addend, the floating add operation to provide a sum in the first floating point format, the adder logic including a rounding scheme of the first precision, wherein the sum includes a second number of a second floating point format having a second precision, the second number representing a conversion of the first number from the first floating point format to the second floating point format.

2. The logic of claim 1, wherein the first number includes a first exponent field and a first mantissa field of the first floating point format, wherein the addend depends on the first exponent field and wherein the addend is independent of the first mantissa field.

3. The logic of claim 2, wherein the sum corresponds to first binary bits of a first size, wherein the second number corresponds to second binary bits of a second size, and wherein the second binary bits correspond to lower half of the first binary bits.

4. The logic of claim 3, further comprising:
a selection logic coupled to the adder logic, the selection logic to extract lower half of the first binary bits for the second number.

5. The logic of claim 2, wherein the second number includes a second mantissa field of the second floating point format, the adder logic configured with a round off scheme, wherein the floating point add operation includes a round off operation to round off the first mantissa field to the second mantissa field according to the round off scheme.

6. The logic of claim 5, wherein the round off scheme is based on round to nearest.

7. The logic of claim 5, wherein the addend corresponds to a plurality of configurations provided in the addend generator logic to control the floating point add operation, and wherein the configurations to cause the round off operation at a rounding bit of the first mantissa field.

8. The logic of claim 7, wherein the configuration specifies a shift size, and wherein the adder logic designates the rounding bit in the first mantissa field for the round off operation according to the shift size.

9. The logic of claim 7, wherein the second number includes a second exponent field and wherein the configurations include a correction from the first exponent field to the second exponent field and where in the configurations cause the adder logic to perform the correction in the floating point add operation.

10. The logic of claim 7, wherein the addend generator logic combines the configurations for the addend, and wherein the combination includes one or more fixed point add operations on bits representing the configurations.

11. A method of operating a computer system to convert representations of a number in separate floating point formats, the computer system including a processor having at least one arithmetic processing unit, the method comprising:
determining an addend in a first floating point format from a first representation of the number in the first floating point format, wherein the first representation is based on a plurality of bits including a first sign bit, a first exponent field of the bits and a first mantissa field of the bits for the first floating point format, wherein the bits represent a first integer based on an unsigned integer format, the first sign bit representing a second integer based on the unsigned integer format, the exponent field of the bits representation third integer based on the unsigned integer format, the mantissa field of the bits representing a fourth integer based on the unsigned integer format, the first integer being equal to an arithmetic sum of the second integer, the third integer and the fourth integer, wherein the addend corresponds to a fifth integer based on the unsigned integer format, and wherein the fifth integer corresponds to a result of arithmetic operations on the third integer based on the unsigned integer format, the result being independent of the fourth integer;
instructing the arithmetic processing unit to perform a floating point add operation to generate a sum in the first floating point format from the addend and the first representation; and
extracting a second representation of the number in a second floating point format from the sum, the second representation including a second sign bit, a second exponent field and a second mantissa field, wherein the first floating point format has a first precision, wherein the second floating format has a second precision different than the first precision.

12. The method of claim 11, wherein the addend is configured in a lookup table and wherein the determination comprises:
identifying an index to the lookup table from the first exponent field based on a difference of the separate biases; and
retrieving the addend from a lookup table indexed by the first exponent field.

13. The method of claim 11, wherein the floating point add operation includes a rounding operation to round off the first mantissa field from the first precision to the second precision for the second mantissa field, and wherein the rounding off is based on round to nearest scheme.

14. The method of claim 13, wherein the determination comprises:
comparing the first exponent field with a first number to determine if the first representation is special, wherein the addend includes a special representation indicating a special value in the second floating point format if the first representation is special.

15. The method of claim 14, wherein the addend includes a first configuration to cause the rounding operation on the first mantissa field if the first representation is not special.

16. The method of claim 15, wherein the addend includes a second configuration to correct the first exponent field for the second exponent field.

17. The method of claim 16, wherein the round off operation generates a leading bit and wherein the addend includes a third configuration to remove the leading bit.

18. The method of claim 17, further comprising:
combining the first, second the third configurations for the addend based on fixed point arithmetic operations.

19. The method of claim 18, further comprising:
adjusting the addend to denormalize the second representation if the number is subnormal for the second floating point format.

20. A machine readable, non-transitory, tangible storage medium storing executable instructions which cause a data processing system to perform a method comprising:
extracting a sign bit and an exponent field from a first representation representing a number in single precision floating point format via a plurality of bits, wherein the bits representing a first integer based on an unsigned integer format, wherein the bits include a signed portion, an exponent portion and a mantissa portion for the single precision floating point format, the sign portion including the sign bit, the exponent portion including the exponent field, the signed portion of the bits representing a second integer based on the unsigned integer format, the exponent portion of the bits representing a third integer based on the unsigned integer format, the mantissa portion of the bits representing a fourth integer based on the unsigned integer format, the first integer being equal to an arithmetic sum of the second integer, the third integer and the fourth integer;
obtaining an addend using the sign bit and the exponent field via a lookup table, wherein the addend represents a fifth integer based on the unsigned integer format, and wherein the fifth integer corresponds to a result of arithmetic operations on the third integer based on the unsigned integer format, the result being independent the fourth integer;
performing a single precision floating point operation to add the first representation of the number and the addend for a resulting sum represented in bits; and
selecting a portion of bits of the resulting sum as a second representation representing the number in half precision floating point format.

21. A computer system comprising:
a memory storing executable instructions for converting representations of a number in separate floating point formats having different precisions;

a first storage allocated to store a first representation of a number in a first floating point format having a first precision, the first representation including a plurality of bits, wherein the bits represent a first integer based on an unsigned integer format, the bits including a signed portion an exponent portion and a mantissa portion for the first floating point format, the signed portion of the bits representing a second integer based on the unsigned integer format, the exponent portion of the bits representing a third integer based on the unsigned integer format, the mantissa portion of the bits representing a fourth integer based on the unsigned integer format, the first integer being equal to an arithmetic sum of the second integer, the third integer and the fourth integer;

a second storage allocated to store a second representation of the number in a second floating point format having a second precision; and a processor coupled to the memory, the first storage and the second storage to execute the instructions from the memory, the processor including an arithmetic unit capable of floating point arithmetic operations, and the processor being configured to
determine an addend represented in the first floating point format from the first representation of the number, wherein the addend corresponds to a fifth integer based on the unsigned integer format, and wherein the fifth integer corresponds to a result of arithmetic operations on the third integer based on the unsigned integer format, the result being independent of the fourth integer,
perform a floating point addition operation via the arithmetic unit to provide a sum of the number and the addend based on a rounding scheme of the first precision, and
extract a portion of a representation of the sum in the first floating point format as the second representation of the number in the second floating point format.

* * * * *